United States Patent [19]

Tutt et al.

[11] Patent Number: 5,989,772
[45] Date of Patent: *Nov. 23, 1999

[54] STABILIZING IR DYES FOR LASER IMAGING

[75] Inventors: Lee W. Tutt; Mitchell S. Burberry, both of Webster; Gary M. Underwood, Victor, all of N.Y.

[73] Assignee: Eastman Kodak Company, Rochester, N.Y.

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/745,352

[22] Filed: Nov. 8, 1996

[51] Int. Cl.$^6$ ............................. B41M 5/03; B41M 5/26
[52] U.S. Cl. ..................... 430/201; 430/200; 430/945; 430/269; 503/227
[58] Field of Search ..................... 347/262, 105; 430/200, 201, 270.19, 945, 269; 503/227

[56] References Cited

U.S. PATENT DOCUMENTS

| | | | |
|---|---|---|---|
| 4,412,231 | 10/1983 | Namba et al. | 430/270.15 |
| 4,656,121 | 4/1987 | Sato et al. | 430/270.19 |
| 4,735,889 | 4/1988 | Namba et al. | 430/270.19 |
| 4,855,281 | 8/1989 | Byers | 503/227 |
| 4,948,777 | 8/1990 | Evans et al. | 503/227 |
| 4,950,639 | 8/1990 | DeBoer et al. | 503/227 |
| 4,973,572 | 11/1990 | DeBoer | 430/200 |
| 5,036,040 | 7/1991 | Chapman et al. | 430/201 |
| 5,219,823 | 6/1993 | Chapman | 430/201 |
| 5,326,676 | 7/1994 | Vanmaele et al. | 430/338 |
| 5,578,549 | 11/1996 | Burberry et al. | 503/227 |
| 5,654,079 | 8/1997 | Tutt et al. | 428/195 |

FOREIGN PATENT DOCUMENTS

93/22142  11/1993  WIPO .

OTHER PUBLICATIONS

Hare et al., "Highly time and space resolved studies . . . " Microchemistry, pp. 123–135, 1994.

*Primary Examiner*—Martin Angebranndt
*Attorney, Agent, or Firm*—Harold E. Cole

[57] ABSTRACT

A laser-exposed thermal recording element comprising a support having thereon a dye layer comprising a dye dispersed in a polymeric binder, the dye comprising a laser light-absorbing dye absorbing at the wavelength of a laser used to expose the element, wherein the dye layer also contains a stabilizing IR-absorbing dye with an absorption wavelength maximum approximately equal to or longer than that of the laser light-absorbing dye.

6 Claims, No Drawings

STABILIZING IR DYES FOR LASER IMAGING

This invention relates to the use of IR-absorbing dyes for laser imaging, and more particularly to the field of laser dye ablation and transfer imaging for the generation of optical masks and monochrome transparencies, such as in the field of imagesetting films, medical imaging, and printing plates.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to one of the cyan, magenta or yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off at least the image dye at the spot where the laser beam impinges upon the element. In ablative imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. Usefulness of such an ablative element is largely determined by the efficiency at which the imaging dye can be removed on laser exposure. The transmission Dmin value is a quantitative measure of dye clean-out: the lower its value at the recording spot, the more complete is the attained dye removal.

Laser dye ablation is useful for the making of masks for the graphic arts industry, such as for masking printing plates, for masking printed circuit boards, and for generation of medical imaging monochrome transparency images. These films are used to mask light to another material or, in the case of medical imaging, to the eye, and are therefore subjected to a long exposure to light. Photostability of the dyes is of primary concern. Some dyes, particularly cyan dyes, have a tendency to fade in a relatively short time period, even on modest exposures from a light table or light box for viewing medical images. This light fade results in a visual lightening and hue shift toward yellow, making the masking films more difficult to align and raising concern that the films no longer are adequate for the purpose for which they were made. Also, in many cases the optimal IR dye for laser absorption has a low photostability, and its degradation products can cause degradation of the visible dyes. In laser transfer applications, degradation of the laser absorbing dye before imaging will cause sensitivity changes in the imaging element.

Copending U.S. application Ser. No. 08/620,055, filed Mar. 21, 1996, discloses the addition of an iron nitrosyl compound to the film, either as a free salt or as a counterion to a cationic dye. There is a problem with this class of compounds in that they contain a metal and have limited solubility in some solvents and/or affect the properties, such as viscosity, of the coating solutions. It is an object of this invention to provide a more general class of compounds for use in stabilization of visible and IR dyes.

This and other objects are achieved in accordance with this invention which relates to a laser-exposed thermal recording element comprising a support having thereon a dye layer comprising a dye dispersed in a polymeric binder, the dye comprising a laser light-absorbing dye absorbing at the wavelength of a laser used to expose the element, wherein the dye layer also contains a stabilizing IR-absorbing dye with an absorption wavelength maximum approximately equal to or longer than that of the laser light-absorbing dye.

Another embodiment of the invention relates to a process of forming a single color, ablation image comprising imagewise-exposing by means of a laser, in the absence of a separate receiving element, a laser-exposed thermal recording element as described above, the laser exposure taking place through the dye side of said element, thereby imagewise-heating the dye layer and causing it to ablate, and removing the ablated material to obtain an image in the laser exposed thermal recording element.

Still another embodiment of the invention relates to a process of forming a laser-induced thermal dye transfer image comprising:

a) contacting the thermal recording element described above with a dye-receiving element;

b) imagewise-heating the thermal recording element by means of a laser; and c) transferring a dye image to the dye-receiving element to form the laser-induced thermal dye transfer image.

It is thought that the degradation of an image dye or laser light absorbing dye is caused by absorption of radiation which directly or indirectly induces decomposition. When a dye of approximately the same or of longer wavelength is placed in relative proximity to an image dye or laser light absorbing dye, the energy can "funnel down" to this lower energy state dye. In the typical case of an IR-sensitized element, the dye with the longest wavelength absorption maximum is the component which absorbs the laser wavelength. Energy absorbed by dyes which absorb at shorter wavelengths can be transferred to the dye with the longest wavelength absorption, which then either undergoes decomposition or energy loss through internal conversion (resulting in heat). Often, this dye with the longest wavelength absorption is slowly sacrificed until the energy can no longer be transferred to any remaining dye, and then the degradation of the shorter wavelength dyes accelerates. In many cases, the laser light-absorbing dye has a low photostability and its degradation products can cause degradation of the dyes which absorb at shorter wavelengths.

In this invention, a stabilizing IR-absorbing dye with an absorption wavelength maximum approximately equal to or longer than that of the laser light-absorbing dye is added to the laser imaging or recording element. This added dye usually has a lower or negligible absorption at the laser wavelength due to the shifted $\lambda_{max}$. Preferably the stabilizing IR-absorbing dye has an absorption wavelength maximum at least about 100 nm longer than that of the laser light-absorbing dye. If the stabilizing IR-absorbing dye is particularly stable, the shorter wavelength dyes will be stabilized for an extremely long time. In the event that the long wavelength dye is unstable, it will be sacrificed thereby extending lifetime of the thermal recording element.

In a preferred embodiment of the invention, the amount of the stabilizing IR-absorbing dye can be, for example, from about 0.01 g/m² to about 0.500 g/m². In another preferred embodiment, the dye layer also has associated therewith an image dye or pigment.

In still another preferred embodiment of the invention, the stabilizing IR-absorbing dye has the following formula:

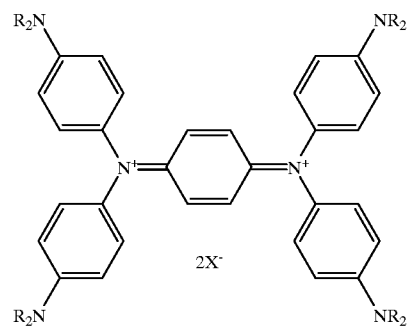

wherein each R individually represents a substituted or unsubstituted alkyl group having from 1 to about 6 carbon atoms, such as methyl, ethyl, propyl, butyl, methoxyethyl, ethoxymethyl, cyanomethyl, etc.; or a substituted or unsubstituted aryl group having from about 6 to about 12 carbon atoms, such as phenyl, methoxyphenyl, naphthyl, etc.; and X represents an anionic counterion associated with the IR-absorbing dye, such as hexafluoroantimonate ($SbF_6^-$) or tetrafluoroborate ($BF_4^-$).

In a preferred embodiment, each R is $C_4H_9$.

Examples of IR-absorbing dyes which may be employed in the invention include the following aminium, polymethine and cyanine dyes which are listed below with the numbers in parentheses of the stabilizing IR dye (SIRS) referring to the Aldrich Chemical Co. (Milwaukee, Wis.) Catalog number:

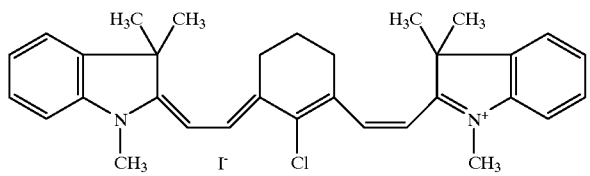

SIR 1 (42,413-7)

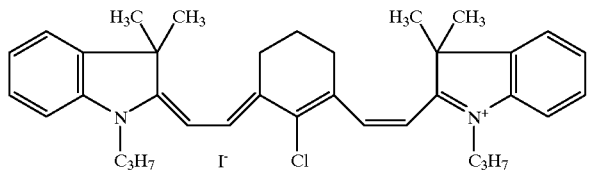

SIR 2 (42,531-1)

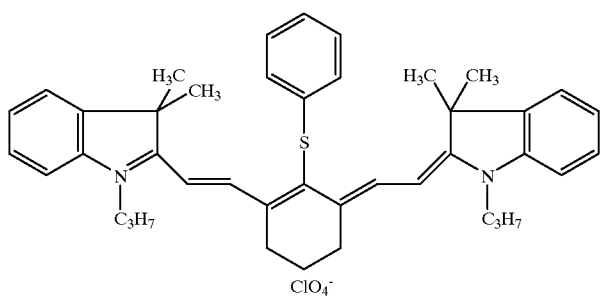

SIR 3 (42,598-2)

SIR 4 (20,093-2)
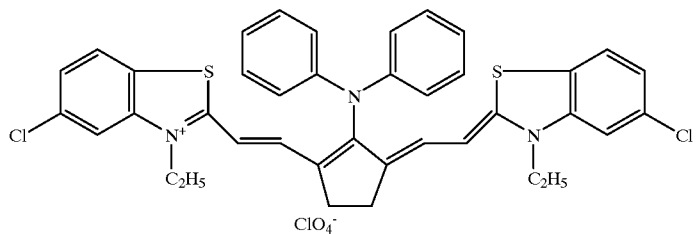
SIR 5 (40,610-4)
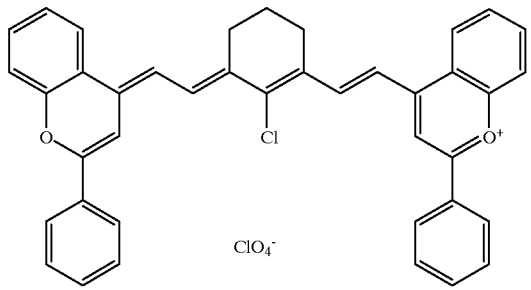
SIR 6 (40,513-2)
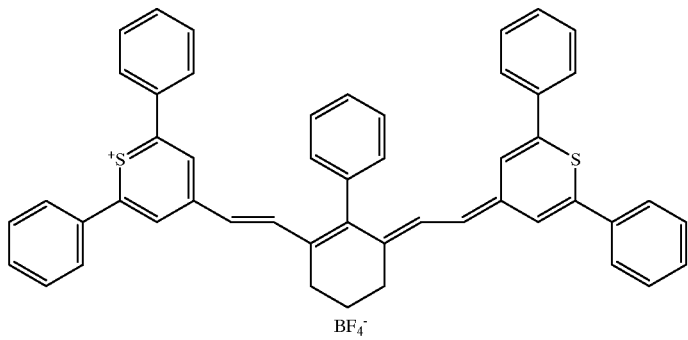
SIR 7 (40,516-7)
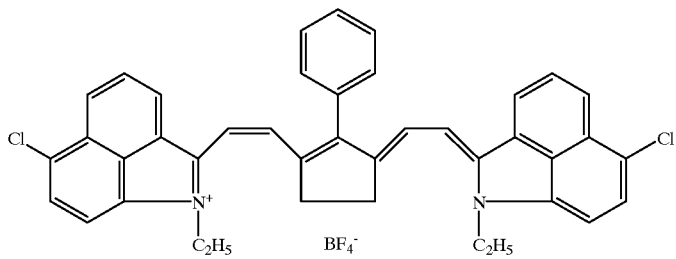
SIR 8 (40,514-0)
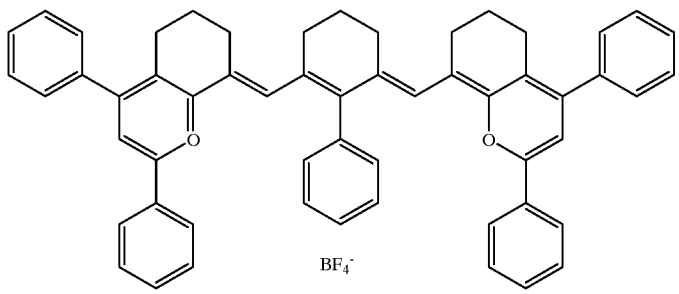

SIR 9 (40,515-9)

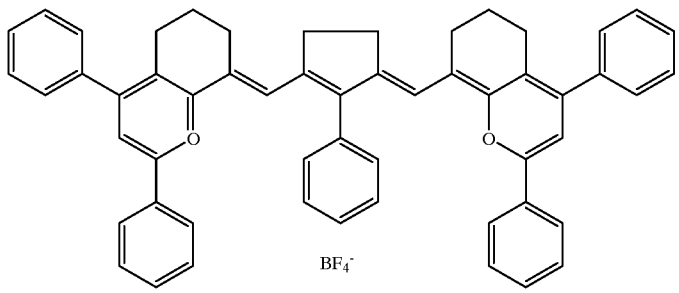

SIR 10

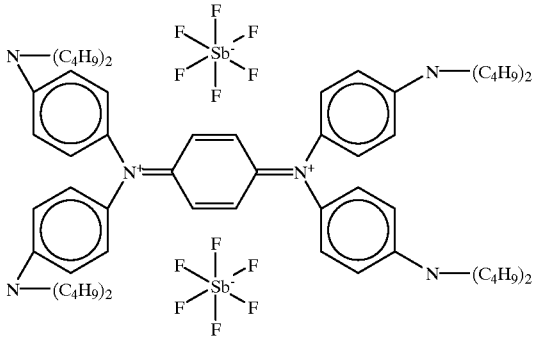

SIR 11

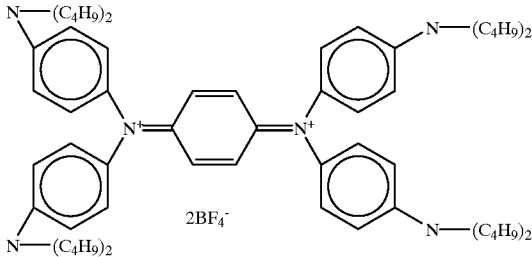

The dye layer of the recording element of the invention may also contain an ultraviolet-absorbing dye, such as a benzotriazole, a substituted dicyanobutadiene, an aminodicyanobutadiene, or any of those materials disclosed in Patent Publications JP 58/62651; JP 57/38896; JP 57/132154; JP 61/109049; JP 58/17450; or DE 3,139,156, the disclosures of which are hereby incorporated by reference. They may be used in an amount of from about 0.05 to about 1.0 g/m².

The recording elements of this invention can be used to obtain medical images, reprographic masks, printing masks, etc. The image obtained can be a positive or a negative image. The process of the invention can generate either continuous (photographic-like) or halftone images.

The invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high blue and UV Dmax. If it does not do this, the printing plate would not be developable to give regions which take up ink and regions which do not.

By use of this invention, a mask can be obtained which has enhanced stability to light for making multiple printing plates or circuit boards without mask degradation.

Any polymeric material may be used as the binder in the recording element employed in the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); polystyrene; poly (styrene-co-acrylonitrile); a polysulfone; a poly(phenylene oxide); a poly(ethylene oxide); a poly(vinyl alcohol-co-acetal) such as poly(vinyl acetal), poly(vinyl alcohol-co-butyral) or poly(vinyl benzal); or mixtures or copolymers thereof. The binder may be used at a coverage of from about 0.1 to about 5 g/m².

In a preferred embodiment, the polymeric binder used in the recording element of the invention has a polystyrene equivalent molecular weight of at least 100,000 as measured by size exclusion chromatography, as described in U.S. Pat. No. 5,330,876, the disclosure of which is hereby incorporated by reference.

A barrier layer may be employed in the laser recording element of the invention if desired, as described in U.S. Pat. No. 5,459,017, the disclosure of which is hereby incorporated by reference.

To obtain a laser-induced, dye image according to the invention, an infrared diode laser is preferably employed since it offers substantial advantages in terms of its small size, low cost, stability, reliability, ruggedness, and ease of modulation.

The recording element of the invention contains an infrared-absorbing material such as cyanine infrared-absorbing dyes as described in U.S. Pat. No. 4,973,572, or other materials, including polymethine dyes as described in the following U.S. Pat. Nos.: 4,948,777; 4,950,640; 4,950,639; 4,948,776; 4,948,778; 4,942,141; 4,952,552; 5,036,040; and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of any image dye, but also on the ability of the dye layer to absorb the radiation and convert it to heat. As used herein, an infrared-absorbing dye has substantial light absorbtivity in the range between about 700 nm and about 1200 nm. In one embodiment of the invention, the laser exposure in the process of the invention takes place through the dye side of an ablative recording element, which enables this process to be a single-sheet process, i.e., no separate receiving element is required.

Lasers which can be used in the invention are available commercially. There can be employed, for example, Laser Model SDL-2420-H2 from Spectra Diode Labs, or Laser Model SLD 304 V/W from Sony Corp.

The dye layer of the recording element of the invention may be coated on the support or printed thereon by a printing technique such as a gravure process.

Any material can be used as the support for the recording element of the invention provided it is dimensionally stable and can withstand the heat of the laser. Such materials include polyesters such as poly(ethylene naphthalate); polysulfones; poly(ethylene terephthalate); polyamides; polycarbonates; cellulose esters such as cellulose acetate; fluorine polymers such as poly(vinylidene fluoride) or poly (tetrafluoroethylene-co-hexafluoropropylene); polyethers such as polyoxymethylene; polyacetals; polyolefins such as polystyrene, polyethylene, polypropylene or methylpentene polymers; and polyimides such as polyimideamides and polyether-imides. The support generally has a thickness of from about 5 to about 200 μm. In a preferred embodiment, the support is transparent.

A thermal printer which uses a laser as described above to form an image on a thermal print medium is described and claimed in U.S. Pat. No. 5,168,288, the disclosure of which is hereby incorporated by reference.

Image dyes useful in one embodiment of the invention include any of the dyes disclosed in U.S. Pat. Nos. 4,541,830; 4,698,651; 4,695,287; 4,701,439; 4,757,046; 4,743,582; 4,769,360; and 4,753,922, the disclosures of which are hereby incorporated by reference. The above dyes may be employed singly or in combination with other dyes. The dyes may be used at a coverage of from about 0.05 to about 1 g/m² and are preferably hydrophobic.

The following examples are provided to illustrate the invention.

Following are the structures of the various materials used in the examples:

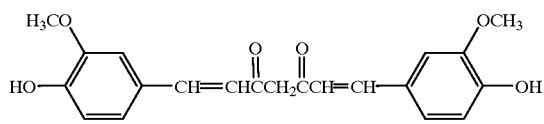

Yellow Dye

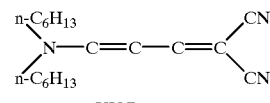

UV Dye

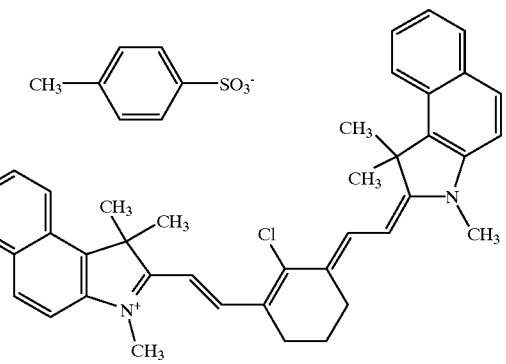

IR Dye-1 (control)

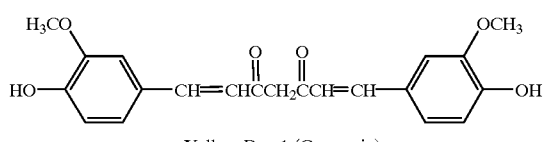

Yellow Dye 1 (Curcumin)

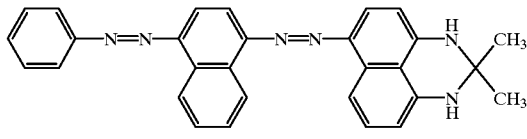

Cyan Dye 1 (Sudan Black B)

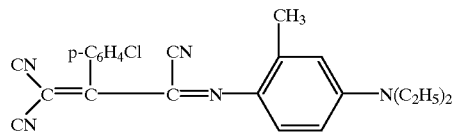

Cyan Dye 2

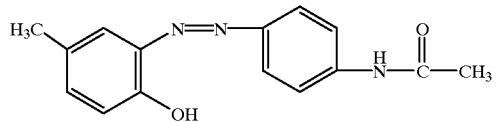

Yellow Dye 2

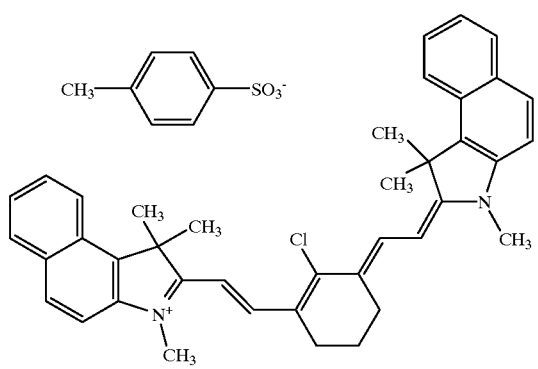

Laser IR Dye 1

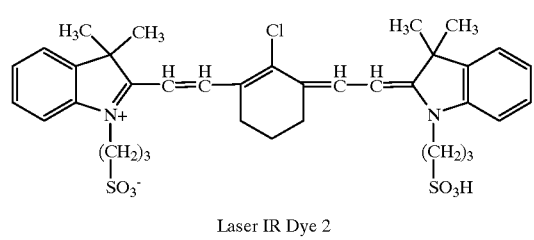

Laser IR Dye 2

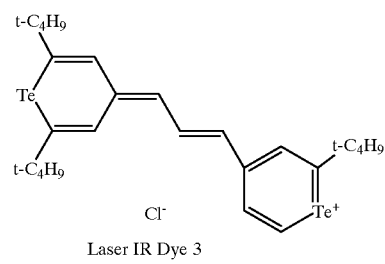

Laser IR Dye 3

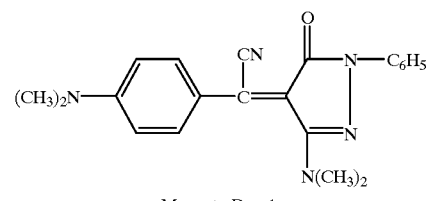

Magenta Dye 1

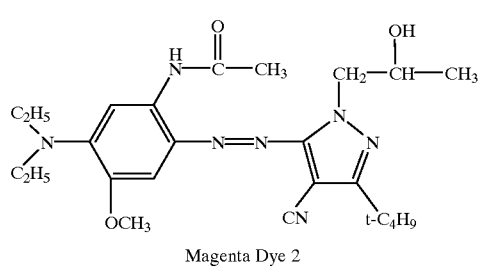

Magenta Dye 2

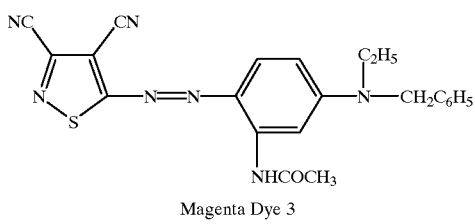

Magenta Dye 3

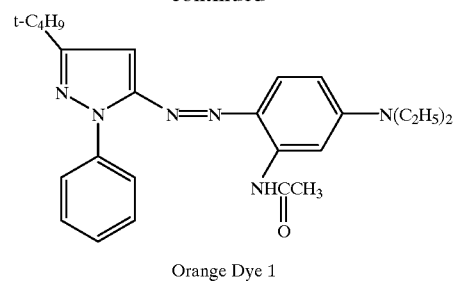

Orange Dye 1

EXAMPLE 1

Preparation of Recording Element

On a 100 μm Estar® poly(ethylene terephthalate) support was coated an imaging layer of:

| Component | Laydown (g/m$^2$) |
| --- | --- |
| Nitrocellulose, 1000–1500 sec | 0.435 |
| Yellow Dye 1 | 0.134 |
| Cyan Dye 1 | 0.237 |
| Yellow Dye 2 | 0.344 |
| Laser IR Dye 1 | 0.168 |
| Stabilizing IR (SIR) Dye. | 0.161 |

A sample of each film was placed into a light exposure apparatus for 8 hours. The samples were positioned such that half of them were protected from light and half of them were exposed to the 50 kLux simulated sunshine. The cyan fade was measured with an X-Rite® Densitometer (Model 820), reading Status A red absorbance. The fade is expressed as a percent change relative to the unexposed regions. The following results were obtained:

TABLE 1

| IR Dye* | λmax (nm) of SIR | Status A Red Dmax | Red Dmax (after 8 hrs) 50 kLux Sunshine | % Dmax Fade |
| --- | --- | --- | --- | --- |
| Control (No SIR dye) | — | 1.41 | 0.69 | 51 |
| SIR 1 | 775 | 1.88 | 0.88 | 53 |
| SIR 2 | 780 | 1.56 | 0.66 | 58 |
| SIR 3 | 792 | 1.64 | 0.69 | 58 |
| SIR 4 | 823 | 1.63 | 0.94 | 42 |
| SIR 5 | 988 | 1.39 | 0.79 | 43 |
| SIR 6 | 1040 | 1.35 | 0.70 | 48 |
| SIR 7 | 1051 | 1.56 | 0.95 | 39 |
| SIR 8 | 1100 | 1.60 | 0.87 | 46 |
| SIR 9 | 1135 | 1.51 | 1.05 | 30 |

*λmax of laser IR dye is 830 nm

The above results show that SIR's 4–9, which have a $\lambda_{max}$ longer than or approximately equal to that of said laser light-absorbing dye, exhibit a stabilization effect in protecting cyan dyes from photodecomposition. When the $\lambda_{max}$ of the SIR dye is at a wavelength significantly shorter than the $\lambda_{max}$ of the laser dye, no stabilization is evident.

EXAMPLE 2

Example 1 was repeated except that Cyan Dye 2 was used instead of Cyan Dye 1 and at a laydown of 0.161 g/m$^2$. The following results were obtained:

TABLE 2

| IR Dye* | SIR Laydown (g/m²) | λmax (nm) of SIR | Status A Red Dmax | Red Dmax (after 8 hrs) 50 kLux Sunshine | % Dmax Fade |
|---|---|---|---|---|---|
| Control (No SIR dye) | — | — | 1.99 | 0.50 | 75 |
| SIR 1 | 0.161 | 775 | 2.52 | 0.28 | 89 |
| SIR 2 | 0.161 | 780 | 2.41 | 0.29 | 88 |
| SIR 3 | 0.161 | 792 | 2.43 | 0.34 | 86 |
| SIR 4 | 0.161 | 823 | 2.24 | 0.64 | 71 |
| SIR 5 | 0.161 | 988 | 2.10 | 0.63 | 70 |
| SIR 7 | 0.161 | 1051 | 2.19 | 0.75 | 66 |
| SIR 8 | 0.161 | 1100 | 2.16 | 0.81 | 63 |
| SIR 9 | 0.161 | 1135 | 2.12 | 1.12 | 47 |
| SIR 10 | 0.161 | 1070 | 2.11 | 1.87 | 11 |
| SIR 11 | 0.161 | 1070 | 2.21 | 1.94 | 12 |
| SIR 10 | 0.215 | 1070 | 2.02 | 1.93 | 4 |
| SIR 11 | 0.215 | 1070 | 2.11 | 1.97 | 7 |

*λmax of laser IR dye is 830 nm

The above results again show that SIR's 4, 5, and 7–11, which have a $\lambda_{max}$ longer than or approximately equal to that of said laser light-absorbing dye, exhibit a stabilization effect in protecting cyan dyes from photodecomposition.

When the $\lambda_{max}$ of the SIR dye is at a wavelength significantly shorter than the $\lambda_{max}$ of the laser dye, no stabilization is evident. The last two rows demonstrate that the fade decreases substantially with increased SIR dye added.

EXAMPLE 3

This example shows a formulation that could be used for monochrome medical imaging (i.e., black) and which contains a number of dyes.

Preparation of Recording Element

On a 100 μm Estar® support was coated an imaging layer of:

| Component | Laydown (g/m²) |
|---|---|
| Nitrocellulose, 1000–1500 sec | 0.538 |
| Yellow Dye 1 | 0.137 |
| Magenta Dye 1 | 0.032 |
| Magenta Dye 2 | 0.032 |
| Magenta Dye 3 | 0.100 |
| Cyan Dye 2 | 0.228 |
| Orange Dye 1 | 0.245 |
| Laser IR Dye 1 | 0.168 |
| Stabilizing IR (SIR) Dye 10 | 0.108 |

This element was tested as in Example 1 that the exposure was 50 kLux High Intensity Daylight (HID) with the following results:

TABLE 3

| IR Dye Stabilizer | Red Dmax | Red Dmax (after 8 hrs) 50 kLux HID | % Dmax Fade |
|---|---|---|---|
| Control (No SIR dye) | 2.40 | 1.82 | 24 |
| SIR 10 | 2.13 | 2.11 | 1 |

The above results show that the stabilization to light degradation occurs even in the presence of a mixture of different visible dyes.

EXAMPLE 4

Example 2 was repeated with other laser light-absorbing dyes as shown below and with the SIR dye at 0.161 g/m².

The films were exposed and measured as in Example 1. The following results were obtained;

TABLE 4

| Laser IR Dye | λmax (nm) of Laser IR Dye | SIR Dye | λmax (nm) of SIR Dye | % Dmax Fade |
|---|---|---|---|---|
| Laser IR Dye 1 (control) | 830 | none | — | 91 |
| Laser IR Dye 1 | 830 | SIR 10 | 1070 | 19 |
| Laser IR Dye 2 (control) | 800 | none | — | 62 |
| Laser IR Dye 2 | 800 | SIR 10 | 1070 | 17 |
| Laser IR Dye 2 | 800 | SIR 9 | 1135 | 24 |
| Laser IR Dye 3 (control) | 830 | none | — | 71 |
| Laser IR Dye 3 | 830 | SIR 10 | 1070 | 18 |
| SIR 1 (control) | 775 | none | — | 87 |
| SIR 1 | 775 | SIR 10 | 1070 | 19 |
| none (control) | — | none | — | 45 |

The above data show that stabilization occurs for other wavelength laser light-absorbing dyes. This example also demonstrates that the stabilization allows one to use laser light-absorbing dyes that actually tend to destabilize the film when not paired with an SIR dye, i.e., the shorter wavelength dyes undergo fade more rapidly than when no laser light-absorbing dyes are present. The addition of the laser light-absorbing dye accelerates the photo-degradation of the shorter wavelength dye. The use of an SIR dye therefore allows one more freedom in the choice of laser light-absorbing dyes used since the addition of an SIR dye significantly improves the light stability.

To get more information on the fading of each individual dye, the complete spectra from 1000 to 400 nm of the films from Example 4 were measured for the light-exposed and unexposed regions. The spectral absorptivity of the films was measured using a Perkin Elmer Lambda 12 Spectrometer. The results are reported as % fade at selected wavelengths, as indicated in Table 5. The 470 nm fade corresponds to Yellow Dye 2, the red 620 nm fade corresponds to Cyan Dye 2 (and correlates well with the status A red density measured), and the 830 nm fade corresponds to the Laser IR dye. The following results were obtained:

TABLE 5

| Laser IR Dye | λmax (nm) of Laser IR Dye | SIR Dye | λmax (nm) of SIR Dye | % Dmax Blue 470 nm Fade | % Dmax Red 620 nm Fade | % Dmax IR 830 nm Fade |
|---|---|---|---|---|---|---|
| Dye 1 (control) | 830 | none | | 52 | 93 | 99 |
| Dye 1 | 830 | SIR 10 | 1070 | 9 | 17 | 25 |
| Dye 2 (control) | 800 | none | | 36 | 65 | 93 |
| Dye 2 | 800 | SIR 10 | 1070 | 12 | 16 | 37 |
| Dye 2 | 800 | SIR 9 | 1135 | 13 | 23 | 46 |
| Dye 3 (control) | 830 | none | | 52 | 69 | 99 |
| Dye 3 | 830 | SIR 10 | 1070 | 15 | 17 | 25 |
| SIR 1 (control) | 775 | none | | 50 | 88 | 99 |
| SIR 1 | 775 | SIR 10 | 1070 | 12 | 16 | 20 |
| none (control) | — | none | | 31 | 45 | 0 |

The above results show that the SIR dye, consistent with this invention, stabilizes (less fade occurs) the yellow, cyan, and laser light-absorbing dyes.

The invention has been described in detail with particular reference to preferred embodiments thereof, but it will be understood that variations and modifications can be effected within the spirit and scope of the invention.

What is claimed is:

1. A laser-exposed thermal recording element capable of forming only a single color comprising a support having thereon a dye layer comprising a dye dispersed in a polymeric binder, said dye comprising an infrared laser light-absorbing dye absorbing at the wavelength of a laser used to expose said element, characterized in that said dye layer also contains a polymethine or cyanine stabilizing IR-absorbing dye having an absorption wavelength maximum at least about 158 nm longer than that of said infrared laser light-absorbing dye, said stabilizing IR-absorbing dye being in relative proximity to said infrared laser light-absorbing dye so that energy which is absorbed by said infrared laser light-absorbing dye is transferred to said stabilizing IR-absorbing dye, said dye layer also containing an image dye or pigment.

2. The element of claim 1 wherein said stabilizing IR-absorbing dye is present in an amount of from about 0.01 g/m$^2$ to about 0.500 g/m$^2$ of said element.

3. A process of forming a single color, ablation image comprising
  a) imagewise-exposing, by means of a laser, in the absence of a separate receiving element, a thermal recording element comprising a support having thereon a dye layer comprising a dye dispersed in a polymeric binder, said dye comprising an infrared laser light-absorbing dye absorbing at the wavelength of said laser used to expose said element, said laser exposure taking place through the dye side of said element, thereby imagewise-heating said dye layer and causing it to ablate, and
  b) removing the ablated material to obtain an image in said thermal recording element;

characterized in that said dye layer also contains a polymethine or cyanine stabilizing IR-absorbing dye having an absorption wavelength maximum at least about 158 nm longer than that of said infrared laser light-absorbing dye, said stabilizing IR-absorbing dye being in relative proximity to said infrared laser light-absorbing dye so that energy which is absorbed by said infrared laser light-absorbing dye is transferred to said stabilizing IR-absorbing dye, said dye layer also containing an image dye or pigment.

4. The process of claim 3 wherein said stabilizing IR-absorbing dye is present in an amount of from about 0.01 g/m$^2$ to about 0.500 g/m$^2$ of said element.

5. A process of forming a single color, laser-induced thermal dye transfer image comprising:
  a) contacting a thermal recording element capable of forming only a single color with a dye-receiving element, said thermal recording element comprising a support having thereon a dye layer comprising a dye dispersed in a polymeric binder, said dye comprising an infrared laser light-absorbing dye absorbing at the wavelength of a laser used to expose said element;
  b) imagewise-heating said thermal recording element by means of a laser; and
  c) transferring a dye image to said dye-receiving element to form said single color, laser-induced thermal dye transfer image;

characterized in that said dye layer also contains a polymethine or cyanine stabilizing IR-absorbing dye having an absorption wavelength maximum at least about 158 nm longer than that of said infrared laser light-absorbing dye, said stabilizing IR-absorbing dye being in relative proximity to said infrared laser light-absorbing dye so that energy which is absorbed by said infrared laser light-absorbing dye is transferred to said stabilizing IR-absorbing dye, said dye layer also containing an image dye or pigment.

6. The process of claim 5 wherein said stabilizing IR-absorbing dye is present in an amount of from about 0.01 g/m$^2$ to about 0.500 g/m$^2$ of said element.

* * * * *